(12) United States Patent
Park et al.

(10) Patent No.: US 9,390,831 B2
(45) Date of Patent: Jul. 12, 2016

(54) ELECTRONIC DEVICE USING ANISOTROPIC CONDUCTIVE COMPOSITION AND FILM

(71) Applicants: Kyoung Soo Park, Uiwang-si (KR); Nam Ju Kim, Uiwang-si (KR); Young Woo Park, Uiwang-si (KR); Joon Mo Seo, Uiwang-si (KR); Kyung Il Sul, Uiwang-si (KR); Dong Seon Uh, Uiwang-si (KR); Arum Yu, Uiwang-si (KR); Hyun Min Choi, Uiwang-si (KR); Jae Sun Han, Uiwang-si (KR)

(72) Inventors: Kyoung Soo Park, Uiwang-si (KR); Nam Ju Kim, Uiwang-si (KR); Young Woo Park, Uiwang-si (KR); Joon Mo Seo, Uiwang-si (KR); Kyung Il Sul, Uiwang-si (KR); Dong Seon Uh, Uiwang-si (KR); Arum Yu, Uiwang-si (KR); Hyun Min Choi, Uiwang-si (KR); Jae Sun Han, Uiwang-si (KR)

(73) Assignee: CHEIL INDUSTRIES INC., Gumi-si, Kyeongsangbuk-do (KR)

( * ) Notice: Subject to any disclaimer, the term of this patent is extended or adjusted under 35 U.S.C. 154(b) by 509 days.

(21) Appl. No.: 13/680,893

(22) Filed: Nov. 19, 2012

(65) Prior Publication Data
US 2013/0126788 A1    May 23, 2013

(30) Foreign Application Priority Data
Nov. 23, 2011  (KR) .................. 10-2011-0122928

(51) Int. Cl.
*H01B 1/22*    (2006.01)
*H01R 4/04*    (2006.01)
(Continued)

(52) U.S. Cl.
CPC ...... *H01B 1/22* (2013.01); *C09J 9/02* (2013.01); *H01B 1/12* (2013.01); *H01B 1/122* (2013.01); *H01R 4/04* (2013.01); *H05K 3/323* (2013.01)

(58) Field of Classification Search
CPC .............. H01B 1/00; H01B 1/22; H01B 1/24; H01L 2924/07811; H05K 3/323; C09J 9/02; H01R 4/04
See application file for complete search history.

(56) References Cited

U.S. PATENT DOCUMENTS

| 2004/0138325 A1* | 7/2004 | Yamaguchi et al. ............ 522/71 |
| 2010/0022801 A1* | 1/2010 | Shinya ............................... 568/6 |

(Continued)

FOREIGN PATENT DOCUMENTS

| CN | 1527869 A | 9/2004 |
| CN | 101679458 A | 3/2010 |

(Continued)

OTHER PUBLICATIONS

Office Action mailed Nov. 19, 2013 in corresponding Chinese Patent Application No. 201210477338.7.

*Primary Examiner* — Mark Kopec
(74) *Attorney, Agent, or Firm* — Lee & Morse, P.C.

(57) ABSTRACT

An electronic device includes a connection material formed from an adhesive composition that includes: a polymer resin; a cationic polymerization catalyst represented by Formula 1; and an organic base,

[Formula 1]

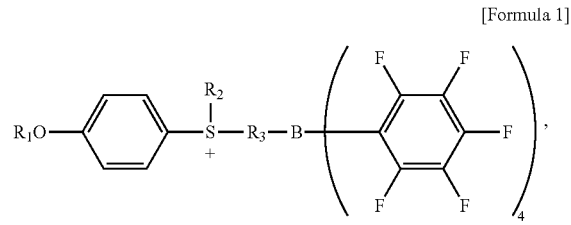

where, in Formula 1, $R_1$ may be selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ may each independently be selected from $C_1$-$C_6$ alkyl and $C_6$-$C_{14}$ aryl), $R_2$ may be $C_1$-$C_6$ alkyl, and $R_3$ may be selected from the group of a nitrobenzyl group, a dinitrobenzyl group, a trinitrobenzyl group, a benzyl group, a $C_1$-$C_6$ alkyl-substituted benzyl group, and a naphthylmethyl group.

10 Claims, 1 Drawing Sheet

(51) Int. Cl.
*H05K 3/32* (2006.01)
*C09J 9/02* (2006.01)
*H01B 1/12* (2006.01)

(56) References Cited

U.S. PATENT DOCUMENTS

2010/0239777 A1* 9/2010 Nakajima ............ C09D 11/322
427/508
2011/0192639 A1* 8/2011 Shinya et al. ................. 174/259
2013/0044168 A1* 2/2013 Kaga .................... B41M 5/0023
347/102

FOREIGN PATENT DOCUMENTS

| | | | |
|---|---|---|---|
| JP | 03-237107 A | | 10/1991 |
| JP | 2010-132614 A | | 6/2010 |
| KR | 1020090050538 | * | 5/2009 ................. C08J 5/22 |

* cited by examiner

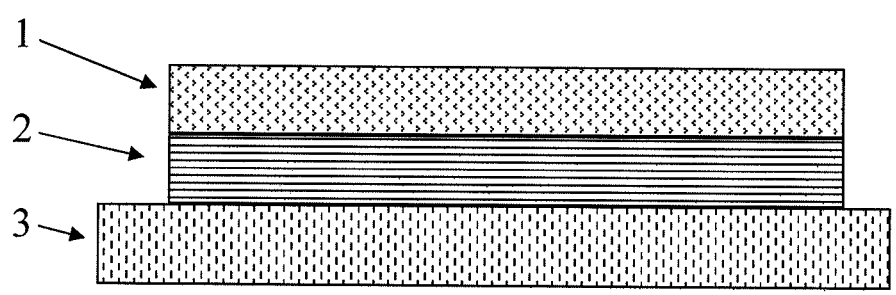

ELECTRONIC DEVICE USING ANISOTROPIC CONDUCTIVE COMPOSITION AND FILM

CROSS-REFERENCE TO RELATED APPLICATION

The present application claims priority under 35 U.S.C. §119 to Korean Patent Application No. 10-2011-0122928, filed on Nov. 23, 2011, in the Korean Intellectual Property Office, and entitled: "Semiconductor Device Using Anisotropic Conductive Composition or Film," which is incorporated by reference herein in its entirety.

BACKGROUND

1. Field

Embodiments relate to an electronic device using an adhesive composition and film.

2. Description of the Related Art

With the recent trend toward large size and slimness in electronic devices such as display devices, pitches between electrodes and between circuits have gradually become finer. Anisotropic conductive adhesive films play an important role as interconnection mechanisms for fine circuit terminals.

SUMMARY

Embodiments are directed to an electronic device including a connection material formed from an adhesive composition that includes: a polymer resin; a cationic polymerization catalyst represented by Formula 1; and an organic base,

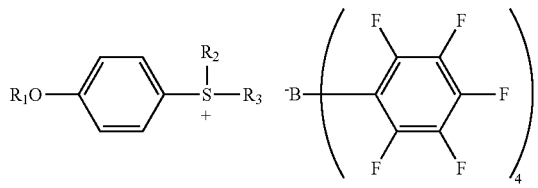

In Formula 1, $R_1$ may be selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ may each independently be selected from $C_1$-$C_6$ alkyl and $C_6$-$C_{14}$ aryl), $R_2$ may be $C_1$-$C_6$ alkyl, and $R_3$ may be selected from the group of a nitrobenzyl group, a dinitrobenzyl group, a trinitrobenzyl group, a benzyl group, a $C_1$-$C_6$ alkyl-substituted benzyl group, and a naphthylmethyl group.

$R_1$ may be selected from the group of hydrogen, $C_1$-$C_4$ alkyl, —C(=O)$R_4$, and —C(=O)O$R_5$ (in which $R_4$ and $R_5$ may each independently be $C_1$-$C_4$ alkyl), $R_2$ may be $C_1$-$C_4$ alkyl, and $R_3$ may be selected from the group of a nitrobenzyl group, a dinitrobenzyl group, a trinitrobenzyl group, and a naphthylmethyl group.

$R_1$ may be methyl, $R_2$ may be methyl, and $R_3$ may be a naphthylmethyl group.

The organic base may include at least one of triethylamine, triisobutylamine, trioctylamine, triisodecylamine, triethanolamine, an ammonium salt, or an aromatic amine.

The polymer resin may include at least one of an epoxy resin or a phenoxy resin.

The cationic polymerization catalyst represented by Formula 1 may be present in an amount of about 0.1 to about 20 parts by weight, based on 100 parts by weight of the polymer resin, and the organic base may be present in an amount of about 0.1 to about 30 parts by weight, based on 100 parts by weight of the cationic polymerization catalyst represented by Formula 1.

The adhesive composition may include conductive particles.

The connection material may be an anisotropic conductive connection material.

Embodiments are also directed to an electronic device including an adhesive film as a connection material, the adhesive film being formed from a mixture that includes a polymer resin and a cationic polymerization catalyst represented by Formula 1, the adhesive film exhibiting a decrease in adhesive strength of about 30% or less after being left at 25° C. for 300 hours,

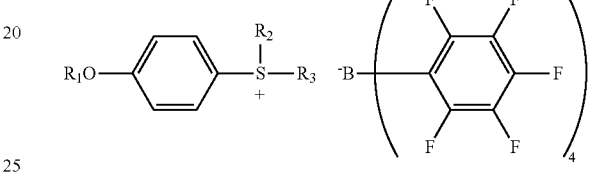

In Formula 1, $R_1$ may be selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ may each independently be selected from $C_1$-$C_6$ alkyl and $C_6$-$C_{14}$ aryl), $R_2$ may be $C_1$-$C_6$ alkyl, and $R_3$ may be selected from the group of a nitrobenzyl group, a dinitrobenzyl group, a trinitrobenzyl group, a benzyl group, a $C_1$-$C_6$ alkyl-substituted benzyl group, and a naphthylmethyl group.

$R_1$ may be selected from the group of hydrogen, $C_1$-$C_4$ alkyl, —C(=O)$R_4$, and —C(=O)O$R_5$ (in which $R_4$ and $R_5$ may each independently be $C_1$-$C_4$ alkyl), $R_2$ may be $C_1$-$C_4$ alkyl, and $R_3$ may be selected from the group of a nitrobenzyl group, a dinitrobenzyl group, a trinitrobenzyl group, and a naphthylmethyl group.

$R_1$ may be methyl, $R_2$ may be methyl, and $R_3$ may be a naphthylmethyl group.

The polymer resin may include at least one of an epoxy resin or a phenoxy resin.

The mixture may include conductive particles.

The organic base may include at least one of triethylamine, triisobutylamine, trioctylamine, triisodecylamine, triethanolamine, an ammonium salt, or an aromatic amine.

BRIEF DESCRIPTION OF THE DRAWING

Features will become apparent to those of skill in the art by describing in detail example embodiments with reference to the attached drawing in which:

FIG. 1 illustrates an electronic device having elements bonded by an anisotropic conductive film according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey example implementations to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An embodiment relates to a electronic device including a connection material formed from an adhesive composition that includes a polymer resin, a cationic polymerization catalyst represented by Formula 1, and an organic base,

[Formula 1]

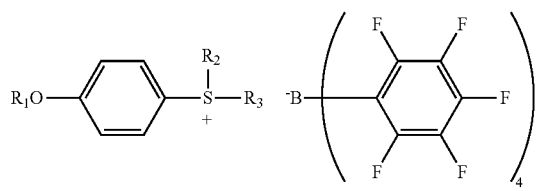

In Formula 1, $R_1$ may be selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ may each independently be selected from $C_1$-$C_6$ alkyl and $C_6$-$C_{14}$ aryl);

$R_2$ may be $C_1$-$C_6$ alkyl; and $R_3$ may be selected from the group of a nitrobenzyl group, a dinitrobenzyl group, a trinitrobenzyl group, a benzyl group that is unsubstituted or substituted by $C_1$-$C_6$ alkyl, and a naphthylmethyl group (methyl-substituted naphthyl).

In an implementation, $R_1$ may be selected from the group of hydrogen, $C_1$-$C_4$ alkyl, —C(=O)$R_4$, and —C(=O)O$R_5$ (in which $R_4$ and $R_5$ may each independently be $C_1$-$C_4$ alkyl), $R_2$ may be $C_1$-$C_4$ alkyl, and $R_3$ may be selected from the group of a nitrobenzyl group, a dinitrobenzyl group, a trinitrobenzyl group, and a naphthylmethyl group.

In an implementation, $R_1$ may be selected from the group of hydrogen, methyl, acetyl, methoxycarbonyl, and ethoxycarbonyl, $R_2$ may be methyl, ethyl, propyl, or butyl, and $R_3$ may be a nitrobenzyl group or a dinitrobenzyl group.

Another embodiment relates to a electronic device using a connection material formed of an adhesive film that includes a polymer resin and a cationic polymerization catalyst that is represented by Formula 1, wherein a decrease of adhesive strength is about 30% or less (e.g., about 0.01% to about 30%) after the film has stood at 25° C. for 300 hours. The decrease may be about 25% or less (e.g., about 0.01% to about 25%), e.g., about 23% or less (e.g., about 0.01% to about 23%).

In an embodiment, the decrease of adhesive strength is calculated by producing a film formed of the composition according to an embodiment, transferring the film onto an ITO wire pattern, adhering thereto an IC chip at 150° C. for 5 seconds at 70 MPa, measuring adhesive strength as an initial adhesive strength ($A_0$), and correspondingly storing the film at 25° C. for 300 hours, adhering an IC chip thereto under the same conditions, measuring an adhesive strength of the film as a final adhesive strength ($A_1$), and substituting these adhesive strengths into Equation of ($A_0$−$A_1$)/$A_0$×100.

The composition according to an embodiment may further include an organic base to prevent premature curing of the polymer resin and the cationic polymerization catalyst at room temperature, thereby reducing or preventing deterioration in adhesive strength when the film is stored at room temperature.

The adhesive composition according to an embodiment may be used for an anisotropic conductive film. The adhesive composition may further include components such as conductive particles and/or silane coupling agents generally used for compositions for anisotropic conductive films.

The adhesive composition according to an embodiment may be advantageously used in the form of a double-layer anisotropic conductive film. Specifically, the adhesive composition according to an embodiment may be used for a double-layer anisotropic conductive film that includes an anisotropic conductive film layer and a non-conductive film layer. The adhesive composition according to an embodiment may be used as a component of the anisotropic conductive film layer and/or the non-conductive film layer.

The adhesive composition and film according to an embodiment may be used as a connection material for, e.g., packaging LCD panels, printed circuit boards (PCB), driver IC circuits, and the like, in an LCD module.

Next, the adhesive composition and the film according to an embodiment will be described in more detail.

Polymer Resin

The polymer resin may be a suitable polymer resin for connecting electrical materials and may be, e.g., a cationic polymer resin such as an epoxy resin that polymerizes in the presence of a cationic polymerization catalyst. Examples of the polymer resins include polymeric vinyl compounds, cyclic lactones, cyclic ethers, and the like. Examples of the polymeric vinyl compounds include styrenes, vinyl ethers, and the like. Examples of the cyclic ethers include epoxy compounds, oxetane compounds, spiro orthoesters, and the like. In an implementation, a phenoxy resin is used, e.g., a bisphenol A epoxy resin.

In an implementation, a thermosetting epoxy resin may be used. For example, a thermosetting epoxy resin having an epoxy equivalent from about 90 to about 5000 and two or more epoxy groups in the molecule may be used.

The thermosetting epoxy resin may be selected from the group of bisphenol-, novolac-, and glycidyl-type aliphatic, alicyclic, aromatic epoxy resins, and combinations thereof, etc. Also, an epoxy resin that is a solid at room temperature may be used in conjunction with an epoxy resin that is a liquid at room temperature, and a flexible epoxy resin may be additionally used in conjunction with these resins. Examples of the solid epoxy resin include phenol novolac epoxy resins, cresol novolac epoxy resins, epoxy resins containing dicyclopentadiene as a main skeleton, bisphenol A or F polymer or modified epoxy resins and the like, etc. Examples of the epoxy resin that is a liquid at room temperature include bisphenol A or F or combined epoxy resins, etc. Examples of the flexible epoxy resin include dimer acid modified epoxy resins, epoxy resins containing propylene glycol as a main skeleton, urethane modified epoxy resins, etc. The aromatic epoxy resin may include one or more of a naphthalene resin, an anthracene, a pyrene resin, etc.

The phenoxy resin used herein means a resin containing a phenoxy moiety and may be, for example, a bisphenol A phenoxy resin, etc. The phenoxy resin may be a resin having a low glass transition temperature. The glass transition temperature (Tg) of the phenoxy resin may be, for example, about 60° C. to about 80° C.

Cationic Polymerization Catalyst

Embodiments may use a cationic polymerization catalyst represented by Formula 1 as a cationic polymerization initiator of the polymer resin.

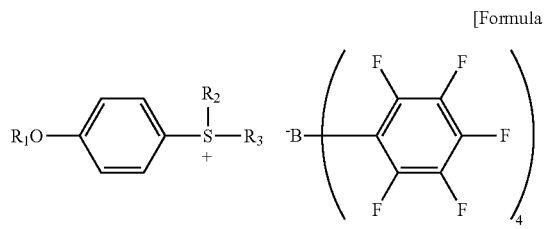

[Formula 1]

In Formula 1,
$R_1$ may be selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ may each independently be selected from $C_1$-$C_6$ alkyl and $C_6$-$C_{14}$ aryl);
$R_2$ may be $C_1$-$C_6$ alkyl; and
$R_3$ may be selected from the group of a nitrobenzyl group, a dinitrobenzyl group, a trinitrobenzyl group, a benzyl group that is unsubstituted or substituted by $C_1$-$C_6$ alkyl, and a naphthylmethyl group.

In an implementation, $R_1$ may be selected from the group of hydrogen, $C_1$-$C_4$ alkyl, —C(=O)$R_4$, and —C(=O)O$R_5$ (in which $R_4$ and $R_5$ are each independently $C_{1-4}$ alkyl), $R_2$ may be $C_{1-4}$ alkyl, and $R_3$ may be selected from the group of a nitrobenzyl group, a dinitrobenzyl group, a trinitrobenzyl group, and a naphthylmethyl group.

In an implementation, $R_1$ may be selected from the group of hydrogen, methyl, acetyl, methoxycarbonyl, and ethoxycarbonyl, $R_2$ may be methyl, ethyl, propyl, or butyl, and $R_3$ may be a nitrobenzyl group or a dinitrobenzyl group.

With the cationic polymerization catalyst represented by Formula 1, the amount of fluorine ions may be minimized during cationic polymerization, and problems such as corrosion of metal wires or connection pads caused by fluorine ions may be reduced. Furthermore, sufficient low-temperature, high-speed curing may be accomplished during semiconductor adhesion.

Formula 1 may be a compound in which $R_1$ is hydrogen, methyl, or acetyl, $R_2$ is methyl or ethyl, and $R_3$ is a trinitrobenzyl group or a naphthylmethyl group.

Formula 1 may be a compound in which $R_1$ is methyl, $R_2$ is methyl, and $R_3$ is a naphthylmethyl group.

Formula 1 may be a compound in which $R_1$ is hydrogen, methyl, or acetyl, $R_2$ is methyl or ethyl, and $R_3$ is a nitrobenzyl group, a dinitrobenzyl group, or a trinitrobenzyl group.

The amount of the cationic polymerization catalyst represented by Formula 1 in the composition may be about 0.1 to about 20 parts by weight, e.g., about 1.0 to about 15 parts by weight, based on 100 parts by weight of the polymer resin. Maintaining the amount of the cationic polymerization catalyst represented by Formula 1 at about 20 parts by weight or less may help avoid decreases in storage stability. Maintaining the amount at about 0.1 parts by weight or more may provide an advantageous degree of curing.

Organic Base

When a cationic polymerization catalyst is added to a polymer resin, cations may be naturally derived from the cationic polymerization catalyst, and these cations may promote polymerization of the polymer resin at room temperature. Without being bound by any specific theory, it is believed that the organic base contained in the composition according to an embodiment imparts electron donors to the composition and captures cations produced from the cationic polymerization catalyst to inhibit gelation of the adhesive composition.

The organic base may be a basic compound that affects functions of the cationic polymerization catalyst and may be, e.g., an amine compound. Examples of the amine compound include triethylamine, triisobutylamine, trioctylamine, triisodecylamine, triethanolamine, ammonium salts, aromatic amines, and combinations thereof.

The organic base may be present in an amount of about 0.1 to about 30 parts by weight, e.g., about 5 to about 25 parts by weight, based on 100 parts by weight of the cationic polymerization catalyst represented by Formula 1. Maintaining the amount of organic base at about 30 parts by weight or less may help promote curing of the adhesive composition. Maintaining the amount at about 0.1 parts by weight or more may help promote the effects on the cationic polymerization catalyst.

Conductive Particles

The conductive particles according to an embodiment may be metal particles, or organic or inorganic particles coated with metal such as gold or silver, etc. Insulated conductive particles may also be used to secure electrical insulation.

The conductive particles may include one or more of metal particles (e.g., including one or more of Ni, Pd, Cu, Ag, Al, Ti, Cr, Au, or the like); carbon; resin particles (e.g., including one or more of polyethylene, polypropylene, polyester, polystyrene, polyvinylalcohol, modified resin particles thereof, or the like) that are coated with metal (e.g., including gold, silver, copper, nickel, or the like); particles obtained by further coating the metal-coated particles with insulated particles; or the like.

The mean particle diameter (D50) of conductive particles may vary according to pitches of applied circuits and may be, e.g., about 2 μm to about 30 μm. In an implementation the mean particle diameter may be about 2 μm to about 6 μm.

Silane Coupling Agent

The silane coupling agent may include one or more of polymeric fluoride group-containing silicon compounds (which may be derived from, e.g., vinyl trimethoxy silane, vinyl triethoxy silane, (meth)acryloxy propyl trimethoxysilane, or the like); epoxy structure-containing silicon compounds (such as 3-glycidyloxy propyl trimethoxysilane, 3-glycidoxy propylmethyl dimethoxysilane, and 2-(3,4-epoxycyclohexyl)ethyl trimethoxysilane); amino group-containing silicon compounds (such as 3-aminopropyl trimethoxysilane, N-(2-aminoethyl)-3-aminopropyl trimethoxysilane, and N-(2-aminoethyl)-3-aminopropyl methyl dimethoxysilane); 3-chloropropyl trimethoxysilane; or the like.

FIG. 1 illustrates an electronic device having elements bonded by an anisotropic conductive film according to an embodiment. The electronic device may include a wiring substrate 3, an anisotropic conductive film 2 attached to an element mounting surface of the wiring substrate 3, and an electrical element (e.g., a semiconductor chip) 1 bonded to the wiring substrate 3 by the anisotropic conductive film 2.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Examples 1 and 2

Preparation of Adhesive Composition

A modified epoxy resin was prepared by dissolving 30 wt % of an epoxy resin (YP50 unmodified bisphenol-A type solid epoxy resin) in solid content in propylene glycol monomethyl ether acetate (PGMEA), and an epoxy resin (YD-128 diglycidyl ether of bisphenol A type resin), a cationic polymerization catalyst (compound of Formula 1 in which $R_1$ is methyl, $R_2$ is methyl, and $R_3$ is naphthylmethyl), triethanol amine, and conductive particles (polymer particles having an average particle diameter of 3.0 μm coated with Ni), which were added in amounts as listed in Table 1, thereby preparing adhesive compositions of Examples 1 and 2. The triethanolamine was added after being diluted to 10% in PGMEA and mixed with the cationic polymerization catalyst.

Comparative Example 1

Preparation of Adhesive Composition

The adhesive composition of Comparative Example 1 was prepared in the same manner as in Examples 1 and 2, except that triethanol amine was not added.

TABLE 1

| Parts by weight | Example 1 | Example 2 | Comparative Example 1 |
|---|---|---|---|
| | | | (solid content) |
| A | 50 | 50 | 50 |
| B | 45 | 45 | 45 |
| C | 10 | 5 | 5 |
| D | 1 | 1 | |
| E | 10 | 10 | 10 |

A: epoxy resin YP-50 (Kukdo Chemical Co., Ltd.) (Molecular weight Mn: 10,000, Mw: 70,000) prepared as PGMEA solution in a solid content of 30%;
B: epoxy resin YD-128 (Kukdo Chemical Co., Ltd.): epoxy equivalent of 185 g/eq;
C: cationic polymerization catalyst (compound of Formula 1 in which $R_1$ is methyl, $R_2$ is methyl, and $R_3$ is naphthylmethyl);
D: triethanolamine;
E: polymer particles having an average particle diameter of 3.0 μm coated with Ni.

Examples 3 and 4

Preparation of Adhesive Film

The adhesive compositions of Examples 1 and 2 were coated on a polyethylene terephthalate film as a release film, followed by drying with hot air at 70° C. for 5 minutes to prepare 20 μm thick adhesive films.

Comparative Example 2

Preparation of Adhesive Film

The adhesive film of Comparative Example 2 was prepared in the same manner as in Examples 3 and 4, except that the composition of Comparative Example 1 was used as the adhesive composition.

Example 5

Evaluation of Physical Properties of Adhesive Films

To measure adhesive strength, each of the adhesive films of Examples 3 and 4 and Comparative Example 2 was transferred from the release film to an ITO wire pattern on an organic substrate (terminal uppermost layer: ITO, Corning 1737F, 10 Ω/sq, t=0.5 mm, ITO thickness 1,400 Å) to have a size of 2×20 mm. Then, an IC chip (chip size=1.5 mm×20 mm, chip thickness=0.3 mm, bump size=13 μm×110 μm, Au-plated bump height=15 μm, bump pitch=16.0 μm) was adhered thereto under conditions of 150° C., 5 seconds, and 70 MPa (in terms of bump area), followed by measuring adhesive strength of the adhesive film.

Then, the film was stored at 25° C. (room temperature) for 300 hours, and an IC chip was adhered thereto under the same conditions, followed by measuring adhesive strength of the adhesive film.

The adhesive strength was measured using a die shear strength meter (BT400PTXY, DAGE). It could be seen that the Example films had a good adhesive strength of 25 MPa or higher after storage. The results of the adhesive strength are shown in Table 2.

TABLE 2

| | | Example 3 | Example 4 | Comparative Example 2 |
|---|---|---|---|---|
| Adhesive strength (MPa) | Initial adhesive strength | 35 | 32 | 28 |
| | At room temperature (300 hr) | 28 | 27 | 12 |

Example 6

Evaluation of Physical Properties of Adhesive Composition

In order to evaluate storage stability, 1.35 mg of each of the adhesive composition solutions of Examples 1 and 2 and Comparative Example 1 was added to 10 ml vials (Φ24×h 72 mm) to prepare an initial sample and samples stored for 30 minutes, 60 minutes, and 150 minutes at 50° C. Then, each of the samples was inverted to measure a drop time (seconds) for which the sample solution reached an upper end of the vial.

Each of the test solutions had a solid content of 50±10% (as measured at 170° C.). It was considered that the solution became a gel when the drop time was 1,000 seconds or more.

The results are shown in Table 3.

TABLE 3

| | Parts by weight | Ex. 1 | Ex. 2 | Comp. Ex. 1 |
|---|---|---|---|---|
| | A | 50 | 50 | 50 |
| | B | 45 | 45 | 45 |
| | C | 10 | 5 | 5 |
| | D | 1 | 1 | |
| | E | 10 | 10 | 10 |
| Drop time | Initial stage | 65 | 74 | 155 |
| | 50° C. × 30 min | 312 | 278 | Gel (not dropped) |

TABLE 3-continued

| Parts by weight | | Ex. 1 | Ex. 2 | Comp. Ex. 1 |
|---|---|---|---|---|
| (seconds) | 50° C. × 60 min | 490 | 290 | Gel (not dropped) |
| | 50° C. × 150 min | 557 | 356 | Gel (not dropped) |

A: epoxy resin YP-50 (Kukdo Chemical Co., Ltd.) (Molecular weight Mn: 10,000, Mw: 70,000) prepared as PGMEA solution in a solid content of 30%;
B: epoxy resin YD-128 (Kukdo Chemical Co., Ltd.): epoxy equivalent of 185 g/eq;
C: cationic polymerization catalyst (compound of Formula 1 in which $R_1$ is methyl, $R_2$ is methyl, and $R_3$ is naphthylmethyl);
D: triethanolamine;
E: polymer particles having an average particle diameter of 3.0 μm coated with Ni.

As can be seen from Tables 2 and 3, the adhesive composition and the adhesive film according to an embodiment include an organic base, as compared with Comparative Example 1 or 2, and advantageously exhibited a lower decrease of adhesive strength and better storage stability after being left at 25° C. for 300 hours than the Comparative Example.

By way of summation and review, the use of anisotropic conductive adhesive films as connection materials demands high connection reliability. Connection resistance and adhesive strength of anisotropic conductive adhesive films (relative to values measured at initial film states) may vary depending on conditions to which the films will be exposed, which may cause a decrease in connection reliability.

Epoxy resin-based adhesives may be used in various application fields, including electric, electronic and construction fields, due to their high adhesive strength and good resistance to water and heat. For use in these fields, epoxy resin-based adhesives may be subjected to heating at a temperature of about 140° C. to about 180° C. for a connection time of about 20 seconds, or at a temperature of about 180° C. to about 210° C. for a connection time of about 10 seconds. Higher circuit density in the field of electronic devices has brought about reductions in the width of electrodes and the intervals between electrodes. Issues such as fall off, peel off, and dislocation of interconnection lines may become apparent at such densities.

Compositions that generate an acid when exposed to exterior environments such as ultraviolet light or heat while stored at room temperature may cause initiation of cationic polymerization and a significant decrease in adhesive strength. Therefore, an adhesive composition and an adhesive film that may suppress deterioration in adhesion and realize rapid curing at low temperatures while containing a polymer resin and a cationic polymerization catalyst is desired. As described above, embodiments relate to an electronic device using, as a connection material, an adhesive composition or an adhesive film including a polymer resin, a cationic polymerization catalyst, and an organic base. Embodiments may provide an adhesive composition and film that may be rapidly cured at a low temperature of 150° C. and exhibit excellent connection reliability when used for anisotropic conductive films due to prevention of reduction in adhesive strength from by the cationic polymerization catalyst. For example, an adhesive film according to an embodiment may exhibit a low decrease in adhesive strength (e.g., from 0.01% to 30%) after being left at 25° C. for 300 hours. Thus, embodiments may provide improved connection reliability when used for anisotropic conductive films.

In addition, the adhesive composition according to an embodiment may not undergo gelation and may exhibit excellent storage stability even after being left at 25° C. for 300 hours. Thus, embodiments may provide an adhesive composition and an adhesive film formed from the composition that are easy to handle and store in semiconductor production lines. Another embodiment may provide an electronic device including, as a connection material, a cationic curable adhesive composition that exhibits excellent storage stability and is easy to handle and store at room temperature. Embodiments may thus realize low-temperature high-speed curing and reduce adhesive strength deterioration, thereby providing excellent connection reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope according to an embodiment as set forth in the following claims.

What is claimed is:

1. An electronic device comprising an anisotropic conductive connection material formed from an anisotropic conductive adhesive composition that includes: a polymer resin; a cationic polymerization catalyst represented by Formula 1; conductive particles, and an organic base, wherein the organic base includes at least one selected from the group of triethylamine, triisobutylamine, trioctylamine, triisodecylamine, triethanolamine, and an ammonium salt

[Formula 1]

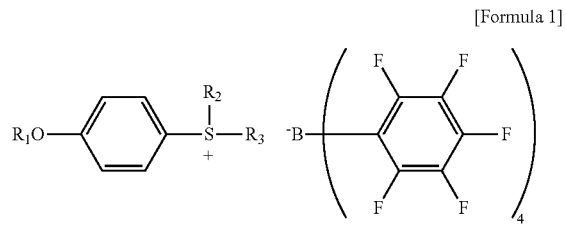

wherein:
$R_1$ is selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$, $R_5$, and $R_6$ are each independently selected from $C_1$-$C_6$ alkyl and $C_6$-$C_{14}$ aryl),
$R_2$ is $C_1$-$C_6$ alkyl, and
$R_3$ is selected from the group of a nitrobenzyl group, a dinitrobenzyl group, a trinitrobenzyl group, a benzyl group, a $C_1$-$C_6$ alkyl-substituted benzyl group, and a naphthylmethyl group.

2. The electronic device as claimed in claim 1, wherein:
$R_1$ is selected from the group of hydrogen, $C_1$-$C_4$ alkyl, —C(=O)$R_4$, and —C(=O)O$R_5$ (in which $R_4$ and $R_5$ are each independently $C_1$-$C_4$ alkyl),
$R_2$ is $C_1$-$C_4$ alkyl, and
$R_3$ is selected from the group of a nitrobenzyl group, a dinitrobenzyl group, a trinitrobenzyl group, and a naphthylmethyl group.

3. The electronic device as claimed in claim 1, wherein $R_1$ is methyl, $R_2$ is methyl, and $R_3$ is a naphthylmethyl group.

4. The electronic device as claimed in claim 1, wherein the polymer resin includes at least one of an epoxy resin or a phenoxy resin.

5. The electronic device as claimed in claim 1, wherein:
the cationic polymerization catalyst represented by Formula 1 is present in an amount of about 0.1 to about 20 parts by weight, based on 100 parts by weight of the polymer resin, and
the organic base is present in an amount of about 0.1 to about 30 parts by weight, based on 100 parts by weight of the cationic polymerization catalyst represented by Formula 1.

6. A electronic device comprising an anisotropic adhesive film as and anisotropic conductive connection material, the anisotropic conductive adhesive film being formed from a mixture that includes a polymer resin, a cationic polymerization catalyst represented by Formula 1, conductive particles, and an organic base, the anisotropic conductive adhesive film exhibiting a decrease in adhesive strength of about 30% or less after being left at 25° C. for 300 hours,

[Formula 1]

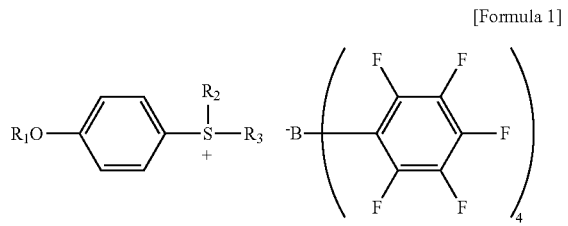

wherein:
$R_1$ is selected from the group of hydrogen, $C_1$-$C_6$ alkyl, $C_6$-$C_{14}$ aryl, —C(=O)$R_4$, —C(=O)O$R_5$, and —C(=O)NH$R_6$ (in which $R_4$ and $R_6$ are each independently selected from $C_1$-$C_6$ alkyl and $C_6$-$C_{14}$ aryl),
$R_2$ is $C_1$-$C_6$ alkyl, and
$R_3$ is selected from the group of a nitrobenzyl group, a dinitrobenzyl group, a trinitrobenzyl group, a benzyl group, a $C_1$-$C_6$ alkyl-substituted benzyl group, and a naphthylmethyl group.

7. The electronic device as claimed in claim 6, wherein:
$R_1$ is selected from the group of hydrogen, $C_1$-$C_4$ alkyl, —C(=O)$R_4$, and —C(=O)O$R_5$ (in which $R_4$ and $R_5$ are each independently $C_1$-$C_4$ alkyl),
$R_2$ is $C_1$-$C_4$ alkyl, and
$R_3$ is selected from the group of a nitrobenzyl group, a dinitrobenzyl group, a trinitrobenzyl group, and a naphthylmethyl group.

8. The electronic device as claimed in claim 6, wherein $R_1$ is methyl, $R_2$ is methyl, and $R_3$ is a naphthylmethyl group.

9. The electronic device as claimed in claim 6, wherein the polymer resin includes at least one of an epoxy resin or a phenoxy resin.

10. The electronic device as claimed in claim 6, wherein the organic base includes at least one selected from the group of triethylamine, triisobutylamine, trioctylamine, triisodecylamine, triethanolamine, and an ammonium salt.

* * * * *